(12) United States Patent
Lin

(10) Patent No.: US 7,140,751 B2
(45) Date of Patent: Nov. 28, 2006

(54) FULL-COLOR FLEXIBLE LIGHT SOURCE DEVICE

(76) Inventor: Yuan Lin, 5 Viewmont Court, Doncaster East, 3109 VIC. (AU)

( * ) Notice: Subject to any disclaimer, the term of this patent is extended or adjusted under 35 U.S.C. 154(b) by 109 days.

(21) Appl. No.: 10/971,082

(22) Filed: Oct. 25, 2004

(65) Prior Publication Data

US 2005/0213321 A1    Sep. 29, 2005

(30) Foreign Application Priority Data

Mar. 24, 2004    (TW)    ................ 93107914 A

(51) Int. Cl.
*F21S 4/00*    (2006.01)
(52) U.S. Cl. .............. 362/250; 362/800; 362/231
(58) Field of Classification Search ............ 362/800, 362/250–251, 221–224, 219, 231, 240, 806; 313/512
See application file for complete search history.

(56) References Cited

U.S. PATENT DOCUMENTS

| | | | |
|---|---|---|---|
| 5,187,377 A * | 2/1993 | Katoh | ................ 257/89 |
| 6,540,377 B1 | 4/2003 | Ota et al. | ................ 362/231 |
| 6,857,767 B1 * | 2/2005 | Matsui et al. | ............. 362/373 |
| 6,923,548 B1 * | 8/2005 | Lim | .................... 362/612 |
| 2003/0052594 A1 * | 3/2003 | Matsui et al. | ............. 313/495 |
| 2003/0071581 A1 * | 4/2003 | Panagotacos et al. | ... 315/185 R |
| 2003/0193803 A1 * | 10/2003 | Lin | .................... 362/250 |
| 2003/0223235 A1 * | 12/2003 | Mohacsi et al. | ........... 362/240 |
| 2004/0109329 A1 * | 6/2004 | Kato | ..................... 362/555 |

* cited by examiner

Primary Examiner—Renee Luebke
Assistant Examiner—Robert May
(74) Attorney, Agent, or Firm—Troxell Law Office, PLLC

(57) ABSTRACT

A full-color flexible light source device is disclosed. The device includes a plurality of light source units each comprises a red LED, a green LED, and a blue LED arranged in the shape of a triangle. Each of the R, G, and B LEDs is a bare chip and the R, G, and B LEDs are encapsulated as a C.O.B. type RGB light source unit. The device is able to emit a uniform light. Also, the device has an increased tensile strength and flexibility as well as has waterproof and vibration-proof features. In other embodiments, the device is encapsulated by elongated, flexible, parallelepiped inner and outer fixing members or formed on a strip.

5 Claims, 7 Drawing Sheets

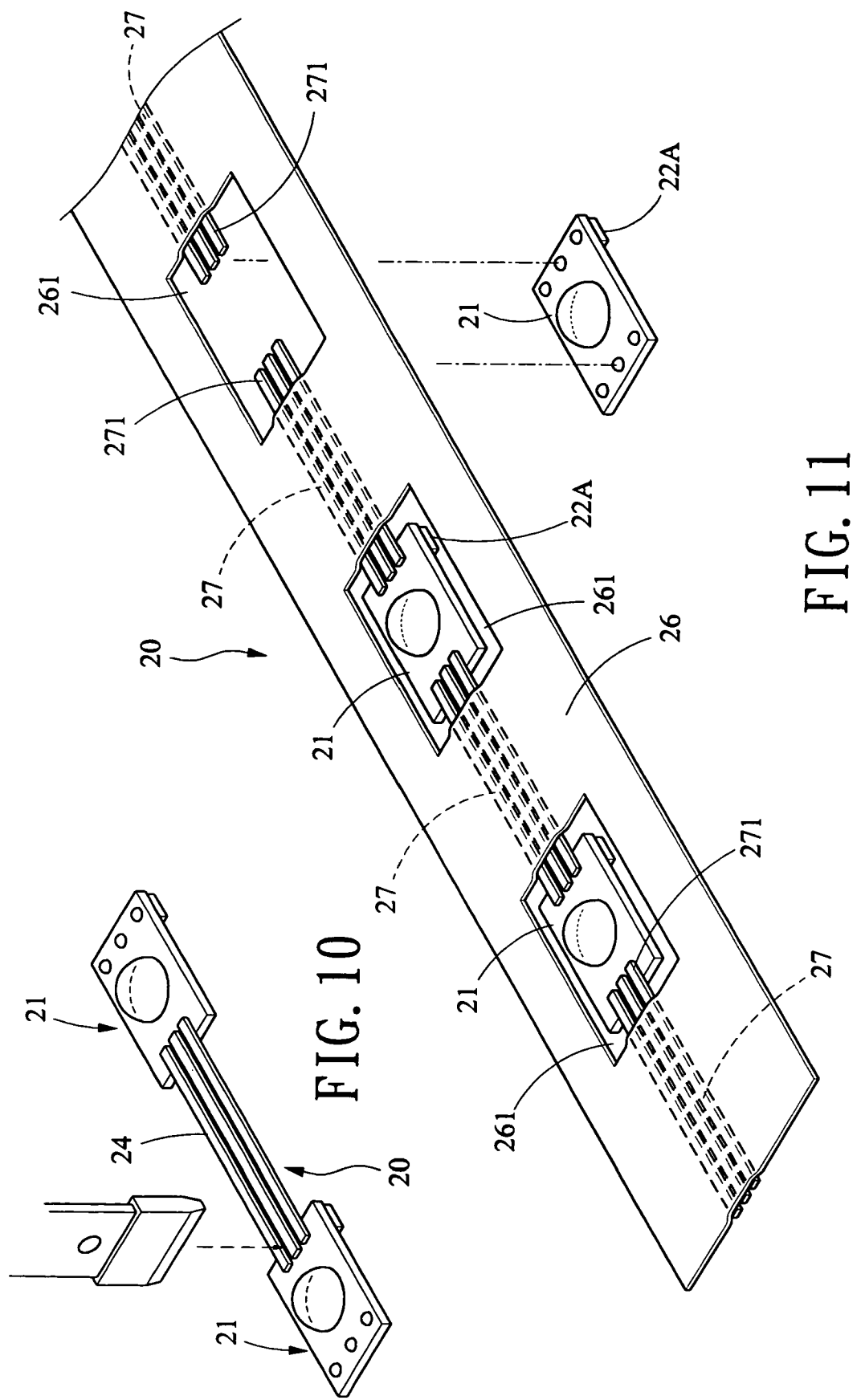

FULL-COLOR FLEXIBLE LIGHT SOURCE DEVICE

BACKGROUND OF THE INVENTION

1. Field of The Invention

The present invention relates to light source units and more particularly to a full-color flexible light source device comprising chip on board type red, green, and blue light source units (e.g., LEDs).

2. Description of Related Art

A conventional light source strip comprises a plurality of LEDs (light-emitting diodes) serially coupled together in which each LED has a coupled resistor and can emit light of single color. A number of drawbacks have been found when the above light source strip is modified to become a full-color light source strip. This is because brightness difference between any two of R (red), G (green), and B (blue) LEDs is quite large. For example, brightness of three R LEDs is equal to that of one B LED. Brightness of six G LEDs is equal to that of one B LED. For obtaining a uniform brightness of the light source strip, a unit thereof is required to consist of three R LEDs, six G LEDs, and one B LED. Such arrangement (i.e., optimum spacing) is difficult of achieving. It is often that an uneven illumination is occurred on the characters and/or marks of a billboard. This is not desirable. Moreover, the size of a full-color light source strip is about three times of that of a monochromatic light source strip if the former is adapted to emit light having a brightness the same as that of the latter. Also, the circuitry of the former is complicated, resulting in an increase in the manufacturing cost. Further, heat dissipation of LED is poor. As a result, LEDs tend to malfunction.

In U.S. Pat. No. 6,540,377 there is disclosed a full-color light source unit for solving the above problem. In the patent, the above unit consisting of three R LEDs, six G LEDs, and one B LED is modified to consist of only two R LEDs, two G LEDs, and one B LED. That is, the number of LEDs has decreased from ten to five. This is an improvement. However, the light source unit is rigid as illustrated in figures thereof. Moreover, the size thereof is quite large and spacing between any two LEDs is also relatively large. All of the above are not desirable. Thus, the need for improvement still exists.

SUMMARY OF THE INVENTION

It is an object of the present invention to provide a full-color flexible light source device in which each of a plurality of light source units thereof comprises a blue bare chip, a red bare chip having brightness three times of that of the blue bare chip, and a green bare chip having brightness six times of that of the blue bare chip, the bare chip is implemented as a C.O.B. (chip on board) type, and the R, G, and B bare chips are arranged in the shape of a triangle prior to being encapsulated as a C.O.B. type RGB LED. The light source device has advantages of being compact, capable of emitting a uniform light, and capable of being assembled quickly.

It is another object of the present invention to provide a full-color flexible light source device in which the C.O.B. type RGB light source units (e.g., LEDs) are coupled in series, and the light source units are in turn encapsulated by a flexible inner fixing member and a flexible outer fixing member so as to form a light source strip having an increased tensile strength and flexibility.

It is still another object of the present invention to provide a full-color flexible light source device in which the C.O.B. type RGB LEDs are coupled in series and are fixed in an elongate, hollow inner fixing member prior to being encapsulated in an outer fixing member by extrusion so as to form a light source strip having waterproof and vibration-proof features.

In one aspect of the present invention a red LED, a green LED, and a blue LED are arranged in the shape of equilateral triangle prior to being encapsulated as a full-color light source unit. The light source unit is in turn controlled by a controller for causing the C.O.B. type RGB LEDs to emit light with uniform full-color.

To achieve the above and other objects, the present invention provides a full-color flexible light source device comprising an inner fixing member; four main wires disposed in the inner fixing member; a plurality of light source units coupled in series; and an outer fixing member for surrounding the inner fixing member; wherein each of the inner and outer fixing members is formed of an elongated, transparent or semi-transparent, flexible plastic material; the inner fixing member comprises a lengthwise channel therethrough, the channel having a section of substantially hollow Z and two lengthwise ridges at both sides, and a lengthwise groove on a center of either top or bottom surface of the inner fixing member; the light source unit comprises a R LED, a G LED, and a B LED as a C.O.B. type RGB LED, conductors, and a resistor, the plurality of light source units being fastened in the channel; the main wires are parallel each other, spaced from the channel in the inner fixing member, coupled to an external controller, coupled to conductors in a forward end of the first light source unit, and coupled to conductors in a rear end of the last light source unit; and the outer fixing member is formed by extrusion with the inner fixing member and the plurality of light source units surrounded therein, and the outer fixing member has flat top and bottom surfaces.

The above and other objects, features and advantages of the present invention will become apparent from the following detailed description taken with the accompanying drawings.

BRIEF DESCRIPTION OF THE DRAWINGS

FIG. 10 is an exploded view of a portion of a light source device according to a third preferred embodiment of the invention; and FIG. 11 is an exploded perspective view of a light source device according to a fourth preferred embodiment of the invention.

DETAILED DESCRIPTION OF THE PREFERRED EMBODIMENTS

Referring to FIGS. 1 to 6, there is shown a light source device 20 constructed in accordance with a first preferred embodiment of the invention. The device 20 comprises a plurality of light source units 21 in which a first group of wires 23R, 23G, and 23B at one side of one light source unit 21 are electrically coupled to a second group of wires 24R, 24G, and 24B at the other side of an adjacent light source unit 21. This forms a serially coupled light source device including a plurality of C.O.B. (chip on board) type RGB light source units 21 (e.g., LEDs). The light source unit 21 comprises a circuit board 21P, a C.O.B. type LED 21R.G.B. Fixedly formed on the circuit board 21P, a first group of wires 23R, 23G, and 23B formed at one side, and a second group of wires 24R, 24G, and 24B formed at the other side.

Figures 2, 3:
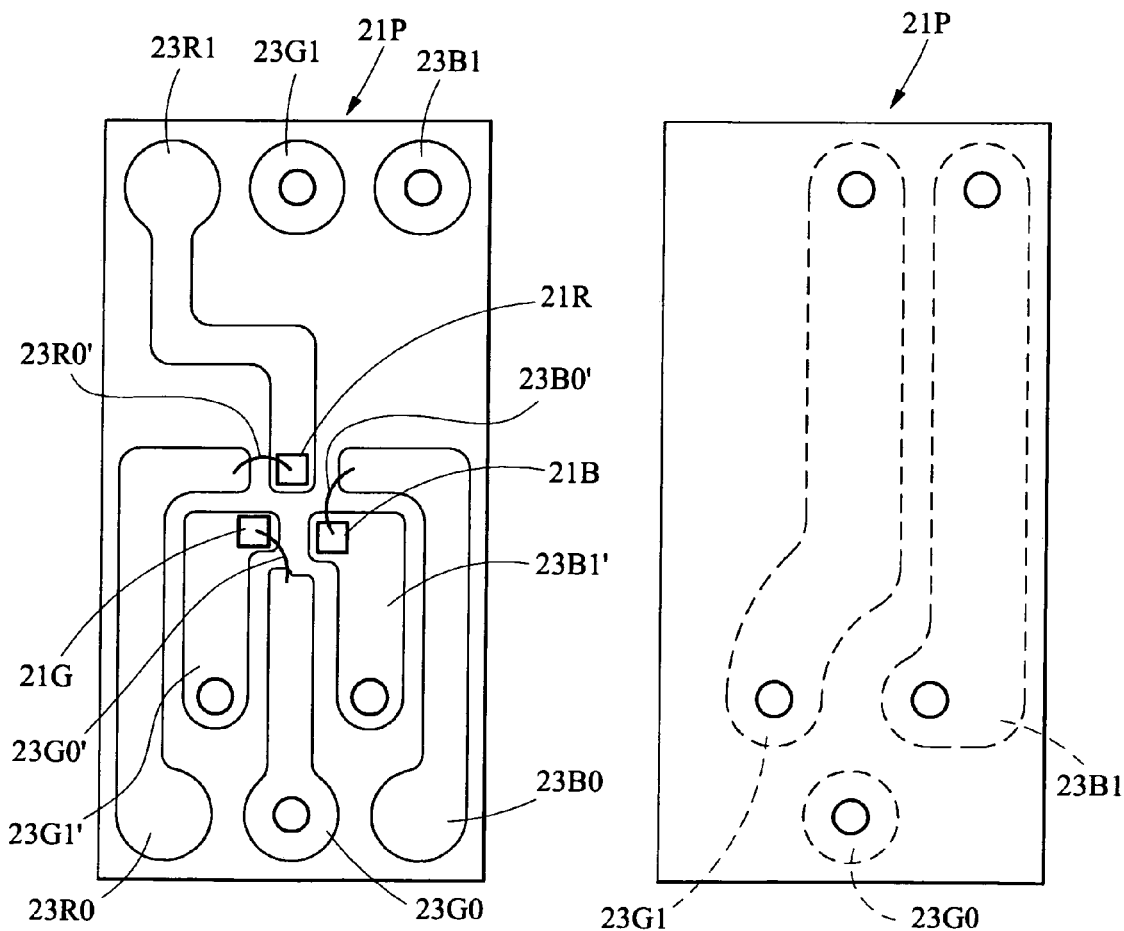
FIG. 2 is a front plan view of the circuit board.
FIG. 3 is a rear plan view of the circuit board.
Figure 4:
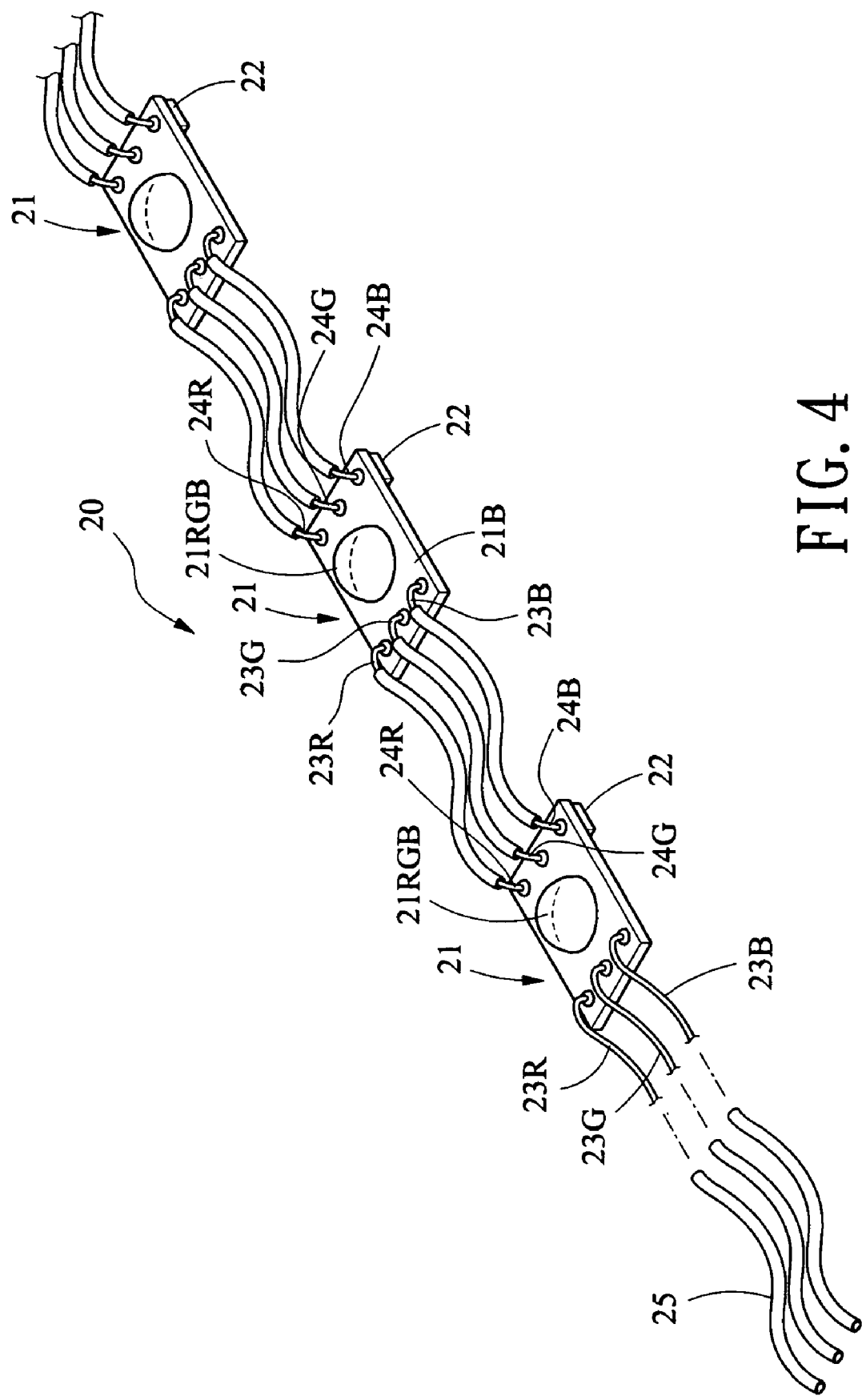
FIG. 4 is a perspective view of a first preferred embodiment of light source device according to the invention, the light source device comprising a plurality of serially coupled light source units of FIG. 1.

In FIGS. 2 and 3, the circuit board 21P is a board having both surfaces formed with printed circuits. The wire 23R is coupled to one end of a first circuit 23R0 on the circuit board 21P. The other end of the first circuit 23R0 is coupled to a red bare chip (i.e., illuminator) 21R via a conductor 23R0'. The red bare chip 21R is formed on the other end of a second circuit 23R1. The wire 24R is coupled to one end of the second circuit 23R1. Similarly, the wire 23G is coupled to one end of a first circuit 23G0 on the circuit board 21P. The other end of the first circuit 23G0 is coupled to a green bare chip 21G via a conductor 23G0'. The green bare chip 21G is formed on the other end of a second circuit 23G1'. One end of the second circuit 23G1' is coupled to the other end of a third circuit 23G1. The wire 24G is coupled to one end of the second circuit 23G1. Also, the wire 23B is coupled to one end of a first circuit 23B0 on the circuit board 21P. The other end of the first circuit 23B0 is coupled to a blue bare chip 21B via a conductor 23B0'. The blue bare chip 21B is formed on the other end of a second circuit 23B1'. One end of the second circuit 23B1' is coupled to the other end of a third circuit 23B1. The wire 24B is coupled to one end of the second circuit 23B1. This forms the electrical connection of the light source unit 21.

Figure 1:
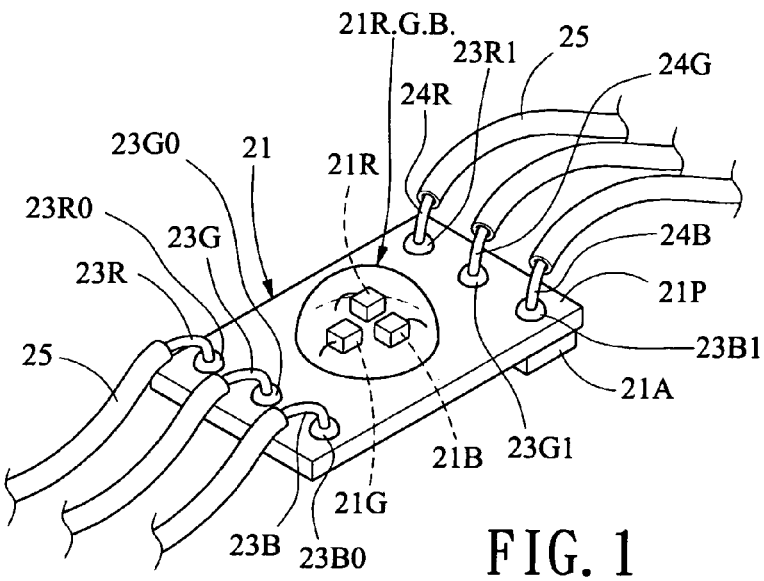
FIG. 1 is a perspective view of a light source unit according to the invention.

As shown in FIG. 1, the R, G, B and blue bare chips 21R, 21G, and 21B are substantially arranged in the shape of an equiangular triangle prior to encapsulation as a C.O.B. type LED (i.e., the light source unit 21). That is, each light source unit 21 comprises a red bare chip, a green bare chip, and a blue bare chip encapsulated as a C.O.B. type LED. Moreover, the brightness ratio among red bare chip 21R, green bare chip 21G, and blue bare chip 21B is 3:6:1 for obtaining a uniform brightness of the light source unit. Preferably, the wavelength of the red bare chip 21R is in the range of $615 \times 10^{-9}$ to $635 \times 10^{-9} (\pi m)$, the wavelength of the green bare chip 21G is in the range of $520 \times 10^{-9}$ to $535 \times 10^{-9} (\pi m)$, and the wavelength of the blue bare chip 21B is in the range of $465 \times 10^{-9}$ to $480 \times 10^{-9} (\pi m)$ respectively.

By incorporating the above three characteristics, the light source unit 21 can be formed as a single full-color light source unit 21 by including a blue bare chip 21B, a red bare chip 21R having brightness three times of that of the blue bare chip 21B, and a green bare chip 21G having brightness six times of that of the blue bare chip 21B. As an end, a bare chip based light source unit capable of emitting a uniform brightness from a number of light sources of different colors is embodied.

The wires 23R, 23G, and 23B coupled between two adjacent light source units 21 are bent. Further, an insulator 25 in the form of sleeve is put on each of the wires 23R, 23G, and 23B. Only the insulator 25 is fixed after extruding from an outer fixing member 40 (see FIG. 7). The wires 23R, 23G, and 23B are bent and slightly flexible so as to prevent the wires 23R, 23G, and 23B from being cut while pulling. The outer fixing member 40 will be bent when the light source device is compressed. Also, the wires 23R, 23G, and 23B may slightly contract due to its flexibility. Such enables the light source device has an increased tensile strength and flexibility while compressing.

Figure 5:
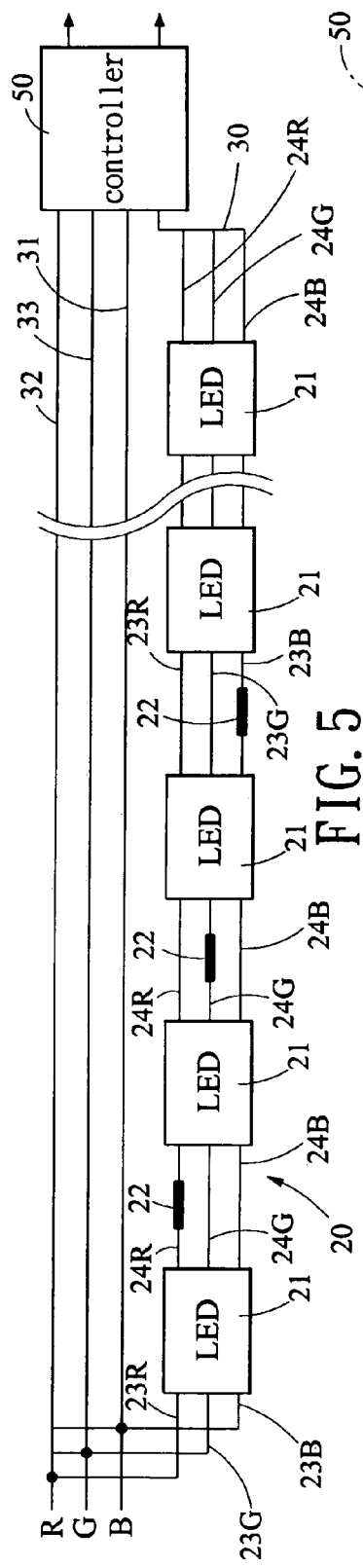
FIG. 5 depicts the connection of a controller to the LEDs of FIG. 4.

The light source device is further electrically coupled to a controller 50 which is in turn coupled to a power source. A resistor (e.g., SMD resistor) 22 (or stabilizer) is provided in each of the wires 24R, 24G, and 24B interconnected two adjacent light source units 21. Alternatively, the resistor 22 (or stabilizer) is provided in the controller 50 or any other position of the circuitry. As shown in FIG. 5, the controller 50 is a coupled to a first main wire 31, a second main wire 32, a third main wire 33, and a fourth main wire 30 of an inner fixing member 10 (see FIG. 7) respectively. A ground line of the controller 50 is coupled to the fourth main wire 30 which is in turn coupled to the second group of wires 24R, 24G, and 24B respectively.

Figure 6:
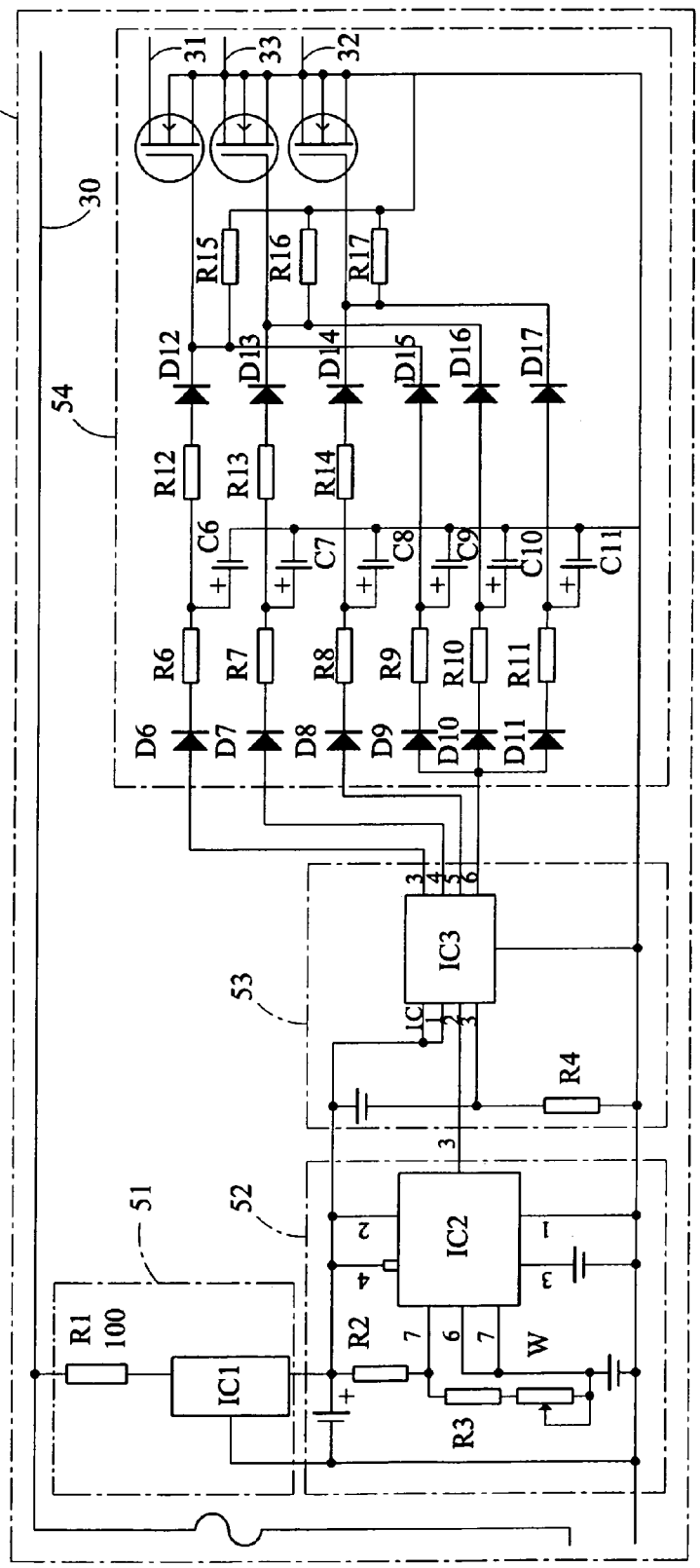
FIG. 6 is a circuit diagram of the controller.

As shown in FIG. 6, the controller 50 comprises a voltage stabilizer 51 including an IC (integrated circuit) IC1, an oscillator 52 including an IC IC2, a frequency divider 53 including an IC IC3, and a driving device 54 including a plurality of diodes D6 to D17, a plurality of resistors R6 to R17, a plurality of capacitors C6 to C11, and three transistors (e.g., SCRs or TRIACs). The oscillator 52 is adapted to generate an oscillating frequency which is further divided by the frequency divider 53 based on the spectrum of the RGB light source unit 21. Next, the driving device 54 is adapted to drive the RGB light source units 21 based on set time duration and time sequence. As an end, a desired light having full-color is obtained.

Figure 7:
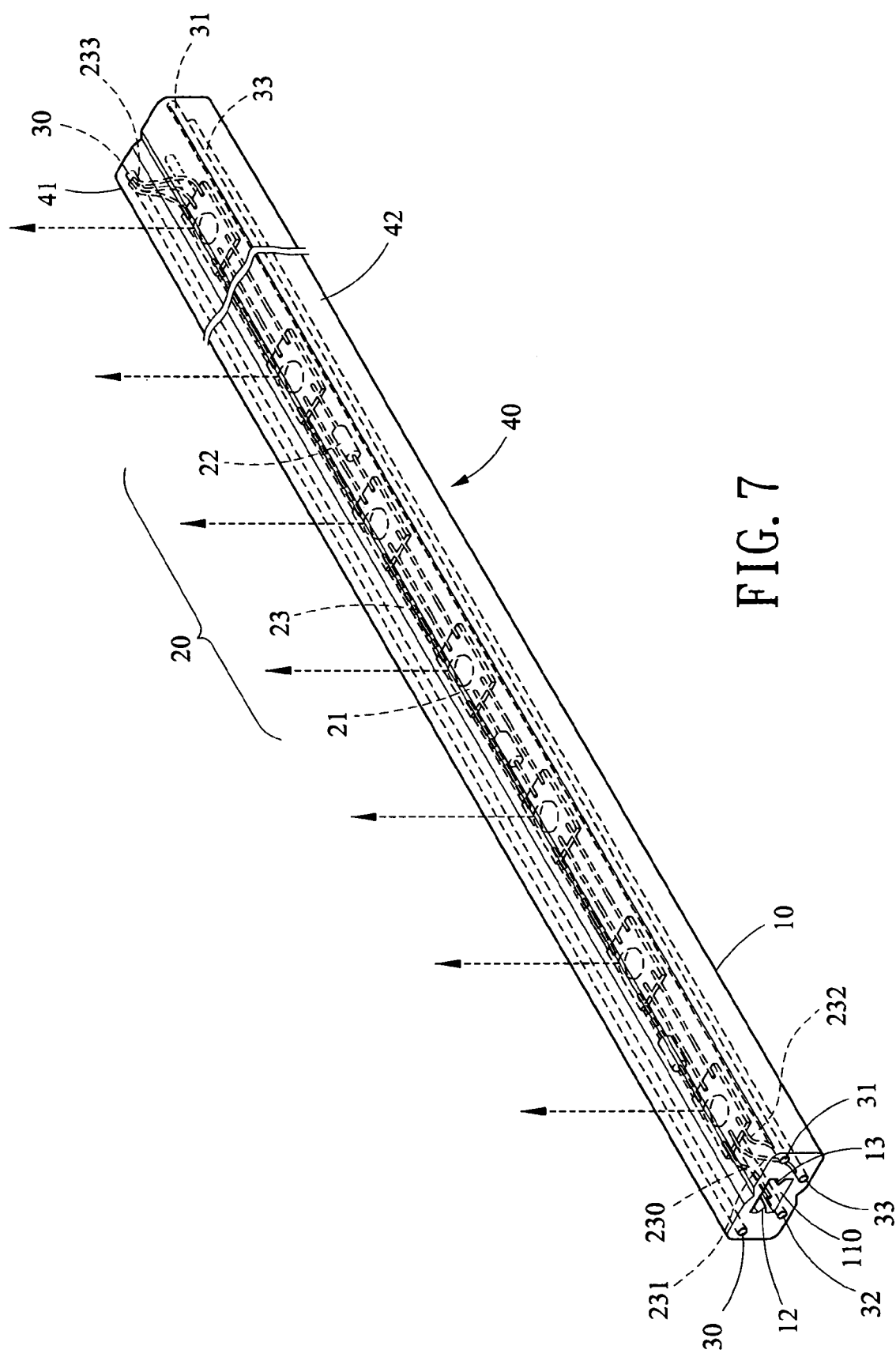
FIG. 7 is a perspective view of a second preferred embodiment of light source device according to the invention.
Figure 8:
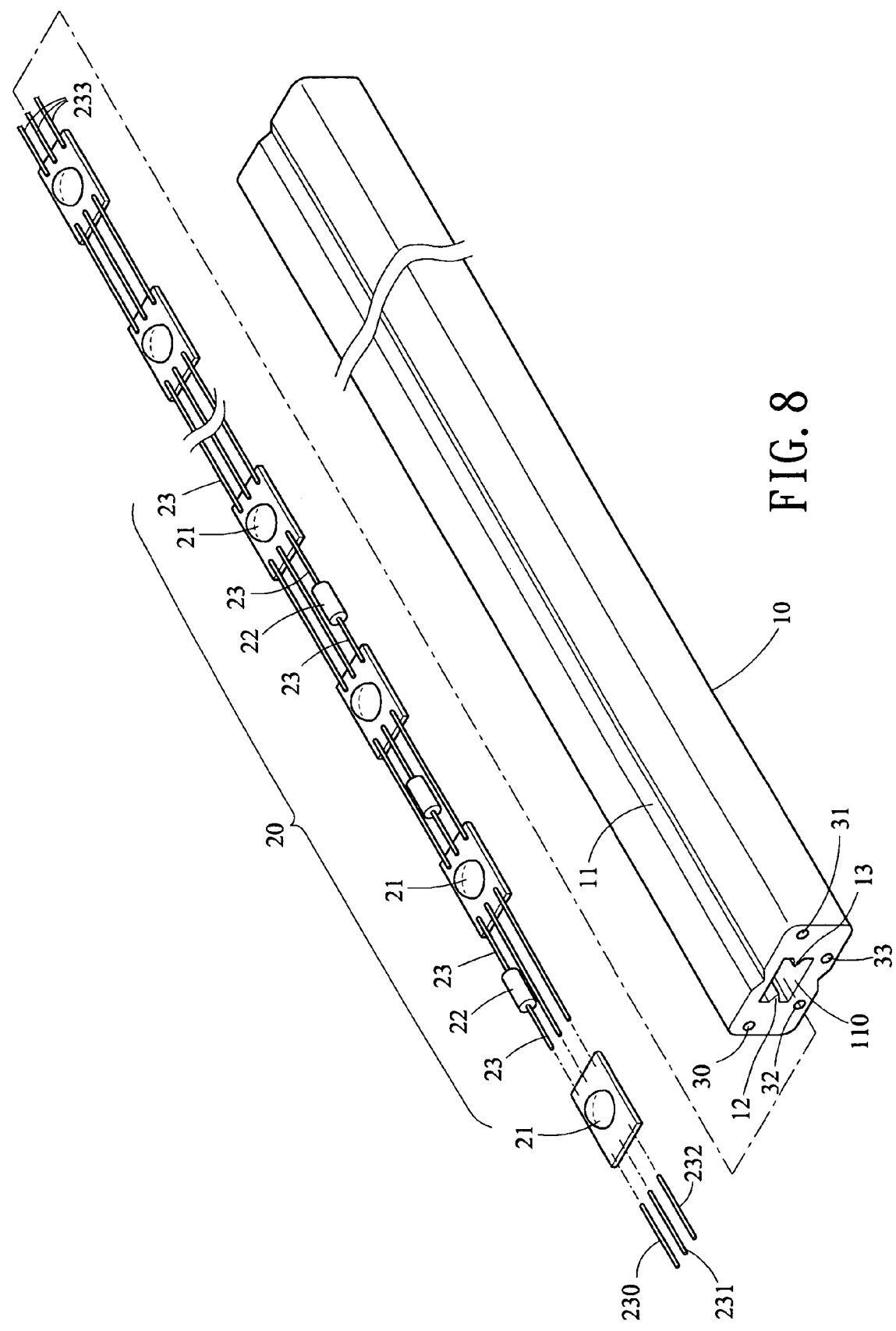
FIG. 8 is a partial exploded view of the light source device of FIG. 7.
Figure 9:
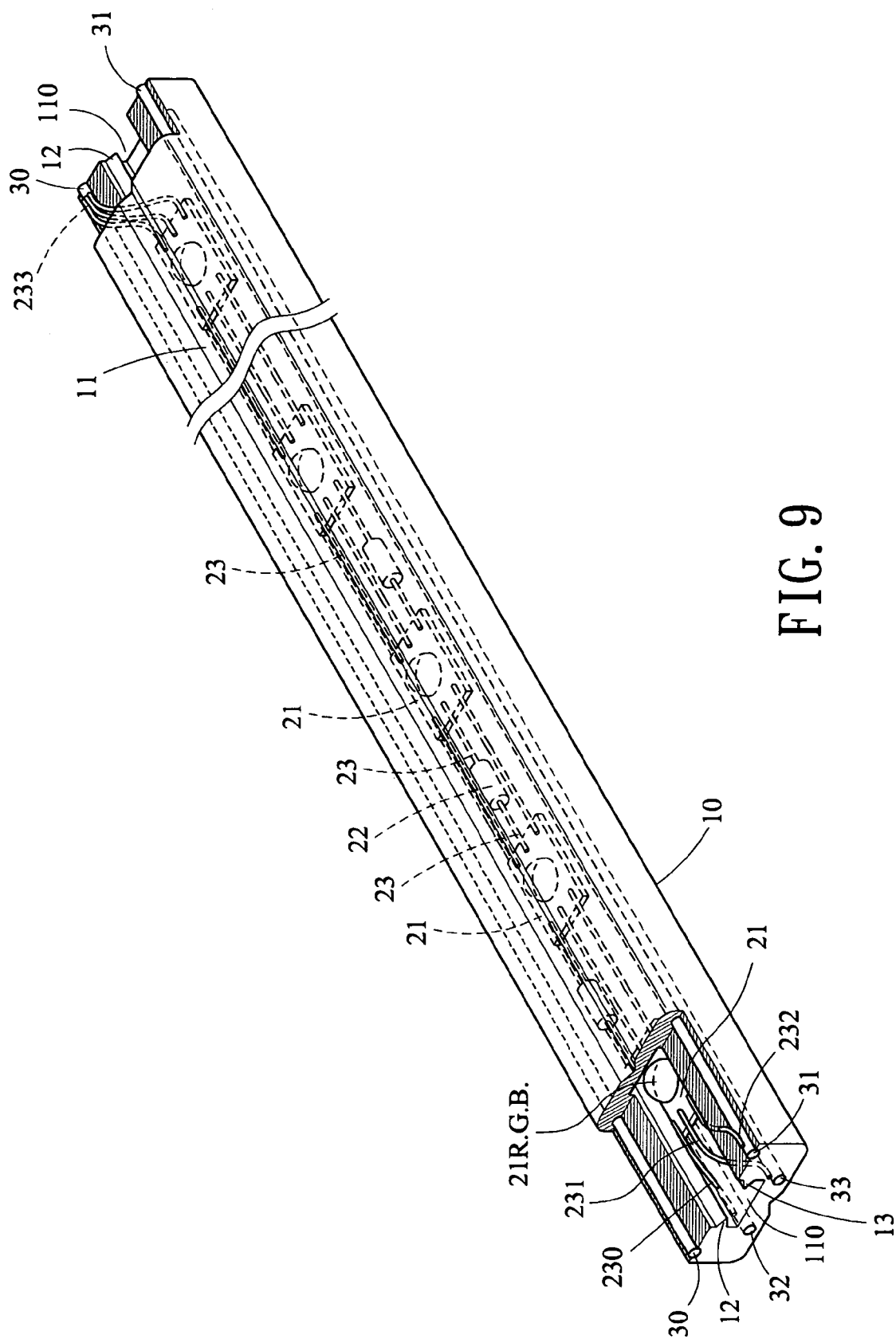
FIG. 9 is a slightly enlarged view of FIG. 7 with portions cut away for showing details.

Referring to FIGS. 7 to 9, there is shown a light source device (i.e., LED strip) 20 constructed in accordance with a second preferred embodiment of the invention. The device 20 is elongated and comprises a plurality of light source units 21 enclosed in an elongated, transparent or semi-transparent, flexible inner fixing member 10. First, second, third, and fourth main wires 31, 32, 33 and 30 are extended along the inner fixing member 10. The inner fixing member 10 is surrounded by an outer fixing member 40 formed of the same material as the inner fixing member 10. There is further provided a controller (not shown).

The inner fixing member 10 is formed of a plastic material. A lengthwise groove 11 is formed on a center of either top or bottom surface of the inner fixing member 10. A lengthwise channel 110 having a section of substantially hollow Z is formed in the inner fixing member 10. Two lengthwise ridges 12 and 13 are formed at both sides of the channel 110. The ridges 12 and 13 are adapted to fasten the light source device 20 in the channel 110 without any other fasteners. Each of the first, second, third, and fourth main wires 31, 32, 33 and 30 is spaced from one of four corners of the channel 110. The light source device 20 comprises a plurality of C.O.B. type LEDs 21 each having R, G, and B bare chips, three wires 23 for connecting the C.O.B. type LEDs 21 in series, and resistors 22 (or stabilizers) each disposed in one of three sections of the wires 23 between two adjacent C.O.B. type LEDs 21.

The controller (not shown) is coupled to the first, second, third, and fourth main wires 31, 32, 33 and 30. The first conductor 230 in the forward end of the light source device 20 is inserted into a front end of the inner fixing member 10 by a tool. The first conductor 230 is coupled to the second main wire 32. Similarly, the second conductor 231 in the forward end of the light source device 20 is inserted into a front end of the inner fixing member 10 by a tool. The second conductor 231 is coupled to the third main wire 33. The third conductor 232 in the forward end of the light source device 20 is inserted into a front end of the inner fixing member 10 by a tool. The third conductor 232 is coupled to the first main wire 31. The fourth conductor 233 in the rear end of the light source device 20 is inserted into the rear end of the inner fixing member 10 via the channel 110 by a tool. The fourth conductor 233 is coupled to the fourth main wire 30. This completes the electrical connection.

The outer fixing member 40 is formed by extrusion. The inner fixing member 10 and the light source device 20 are encapsulated in an airtight environment so as to form a light source strip having increased tensile strength and flexibility and being waterproof and vibration-proof. A top or bottom surface of the outer fixing member 40 is flat. Further, the light source device 20 is in turn controlled by the controller 50 for causing the C.O.B. type RGB light source units 21 to emit light with uniform full-color.

The flat top and bottom surfaces of the outer fixing member 40 facilitates the light source device to mount on an object and fasten thereat. Also, light is emitted in a direction perpendicular to the surface of the outer fixing member 40 for obtaining an increased brightness. The light source device 20 is adapted to bend without adversely affecting light emission. This is because, as stated above, the light source device has increased tensile strength and flexibility.

Referring to FIG. 10, there is shown a light source device 20 constructed in accordance with a third preferred embodiment of the invention. The characteristic of the third preferred embodiment is that three copper wires 24 are interconnected two adjacent C.O.B. type RGB LEDs 21 by soldering.

Referring to FIG. 11, there is shown a light source device 20 constructed in accordance with a fourth preferred embodiment of the invention. In the manufacturing process, the device 20 is first placed on an elongated, flexible sheet 26. The sheet 26 comprises a plurality of equally spaced rectangular openings 261 for receiving the C.O.B. type RGB LEDs 21 having a SMD (surface mounting) resistor 22A on its bottom. Three sections of conductive metal wires 27 are disposed between two adjacent openings 261 in which both ends 271 of the wires 27 are exposed for coupling to the C.O.B. type RGB LEDs 21 by soldering. Next, remove the sheet 26 with the light source device 20 fixedly formed in the inner fixing member. Such can provide an equal spacing between any two adjacent light source units 21 for facilitating mass production.

Note that the sheet 26 and the conductive metal wires 27 can be formed as a peeling strip. Further, the plurality of openings 261 are formed by punching on the sheet 26. The conductive metal wires 27 are also cut into a plurality of sections each having two exposed ends 271. Next, turn the peeling strip upside down so that the C.O.B. type RGB LED 21 can be fixedly coupled between two adjacent wires 27 for forming a serially coupled light source device 20.

Further note that the connection of the C.O.B. type RGB LEDs 21 and the wires 27 can be done by a plurality of soldering in one time for saving time and cost in mass production.

While the invention herein disclosed has been described by means of specific embodiments, numerous modifications and variations could be made thereto by those skilled in the art without departing from the scope and spirit of the invention set forth in the claims.

What is claimed is:

1. A full-color light source device comprising:
 a plurality of chip on board (C.O.B.) type light source units each including a red light emitting diode R LED), a green light emitting diode (G LED), and a blue light emitting diode (B LED);
 a controller; and
 a plurality of circuit boards each having the R LED, G LED, and B LED formed thereon and comprising three first contacts at one end in electrical connection to three second contacts at the other end of a first adjacent circuit board by three conductors, and three second contacts at the other end in electrical connection to three second contacts at one end of a second adjacent circuit board opposite to the first adjacent circuit board by three conductors;
 wherein the contacts at one end of the first light source unit are coupled to R, G, and B main wires of the controller, the contacts at the other end of the last light source unit are coupled together prior to coupling to the controller;
 wherein the controller further comprises a voltage stabilizer, an oscillator, a frequency divider, and driving means.

2. A full-color light source device comprising:
 an inner fixing member;
 a first main wire, a second main wire, a third main wire, and a fourth main wire being disposed in the inner fixing member;
 a plurality of light source units each having a first, a second, and a third conductors coupled in series wherein a first light source unit has the first, second, and third conductors connected to the first main wire, second main wire, third main wire, respectively, and a last light source unit has the first, second, and third conductors connected to the fourth main wire; and
 an outer fixing member for surrounding the inner fixing member; wherein
 the inner fixing member is formed of an elongated, transparent or semi-transparent, flexible plastic material, the inner fixing member including a lengthwise channel therethrough;
 the light source unit further comprises a red light emitting diode R LED), a green light emitting diode (G LED), and a blue tight emitting diode (B LED), as a chip on board (C.O.B.) type RGB LED, the plurality of light source units are inserted into the channel;
 the first, second, third, and fourth main wires are parallel each other, spaced from the channel in the inner fixing member, and coupled to an external controller;
 the first conductor in a forward end of the first light source unit is inserted into a front end of the inner fixing member to couple to the second main wire, the second conductor in the forward end of the light source unit is inserted into the front end of the inner fixing member to couple to the third main wire, the third conductor in the forward end of the light source unit is inserted into the front end of the inner fixing member to couple to the first main wire, and the fourth conductor in a rear end of the light source unit is inserted into a rear end of the inner fixing member to couple to the fourth main wire for forming an electrical connection;

the outer fixing member is made of an elongated, transparent or semi-transparent, flexible plastic material, the outer fixing member being formed by extrusion with the inner fixing member and the plurality of light source units surrounded therein;

the plurality of light source units are equally spaced.

3. The full-color light source device of claim 2, wherein the light source unit is disposed on a circuit board having a surface mounted (SMD) resistor coupled to the light source unit.

4. The full-color light source device of claim 3, further comprising a peeling strip including a sheet including a plurality of equally spaced openings by punching, and a conductive metal wire cut into a plurality of wire sections by cutting, and wherein each wire section has both ends exposed, the light source unit is disposed in the opening, and the exposed ends of the conductive metal wire sections are interconnected two adjacent light source units by soldering after turning the peeling strip upside down.

5. The full-color light source device of claim 2, wherein the sheet of the peeling strip is secured to the inner fixing member by adhering.

* * * * *